(12) United States Patent
Kawazoe et al.

(10) Patent No.: US 8,692,153 B2
(45) Date of Patent: Apr. 8, 2014

(54) METHOD FOR MANUFACTURING PHOTOELECTRIC-CONVERSION-DEVICE, DEVICE FOR PHOTOELECTRIC-CONVERSION-DEVICE MANUFACTURING DEVICE, AND PHOTOELECTRIC CONVERSION DEVICE

(75) Inventors: Kohei Kawazoe, Nagasaki (JP); Kazutaka Uda, Nagasaki (JP); Tomoyoshi Baba, Nagasaki (JP); Takashi Ishide, Takasago (JP); Sachiko Nakao, Nagasaki (JP)

(73) Assignee: Mitsubishi Heavy Industries, Ltd., Tokyo (JP)

( * ) Notice: Subject to any disclaimer, the term of this patent is extended or adjusted under 35 U.S.C. 154(b) by 39 days.

(21) Appl. No.: 13/131,815

(22) PCT Filed: Aug. 25, 2009

(86) PCT No.: PCT/JP2009/064745
§ 371 (c)(1),
(2), (4) Date: May 27, 2011

(87) PCT Pub. No.: WO2010/119581
PCT Pub. Date: Oct. 21, 2010

(65) Prior Publication Data
US 2011/0226748 A1    Sep. 22, 2011

(30) Foreign Application Priority Data
Apr. 13, 2009    (JP) ................................. 2009-097328

(51) Int. Cl.
*B23K 26/40*    (2006.01)
*B23K 26/067*   (2006.01)

(52) U.S. Cl.
USPC ............. 219/121.69; 219/121.73; 219/121.77

(58) Field of Classification Search
USPC ............. 219/121.67, 121.68, 121.69, 121.72, 219/121.73, 121.74, 121.77
See application file for complete search history.

(56) References Cited

U.S. PATENT DOCUMENTS 4,734,550 A * 3/1988 Imamura et al. ......... 219/121.77
4,970,368 A * 11/1990 Yamazaki et al. ........ 219/121.69
(Continued)

FOREIGN PATENT DOCUMENTS

JP       63-121813 A  *  5/1988
JP       7-27994 A    *  1/1995
(Continued)

OTHER PUBLICATIONS

Machine translation of Japan Patent document No. 2006-110,587, Feb. 2013.*

(Continued)

*Primary Examiner* — Geoffrey S Evans
(74) *Attorney, Agent, or Firm* — Manabu Kanesaka; Kenneth M. Berner; Benjamin J. Hauptman

(57) ABSTRACT

Provided is a method for manufacturing a photoelectric-conversion-device capable of controlling the groove depth of a processed groove to a desired value. The method for manufacturing a photoelectric conversion device (10) includes a groove forming step of irradiating an intermediate-contact-layer separating groove (15) constituting a photoelectric conversion device (10) with a picosecond laser and of moving the picosecond laser relative to the intermediate-contact-layer separating groove (93), thereby forming a processed groove (15) in a predetermined scanning direction. In the groove forming step, interference fringes arranged in parallel in one direction are formed in an irradiated area corresponding to a beam diameter of the picosecond laser, and the picosecond laser is relatively moved such that the interference fringes are joined in the scanning direction.

13 Claims, 11 Drawing Sheets

(56) References Cited

U.S. PATENT DOCUMENTS

| | | | |
|---|---|---|---|
| 5,072,091 A * | 12/1991 | Nagata et al. | 219/121.68 |
| 5,864,430 A * | 1/1999 | Dickey et al. | 219/121.69 |
| 5,880,430 A * | 3/1999 | Wein | 219/121.69 |
| 5,932,118 A * | 8/1999 | Yamamoto et al. | 219/121.69 |
| 2002/0066478 A1* | 6/2002 | Hayashi et al. | 136/244 |
| 2003/0172967 A1* | 9/2003 | Tachibana et al. | 136/244 |
| 2006/0261050 A1* | 11/2006 | Krishnan et al. | 219/121.74 |
| 2007/0062919 A1* | 3/2007 | Hamada et al. | 219/121.73 |
| 2007/0272668 A1* | 11/2007 | Albelo et al. | 219/121.72 |
| 2008/0110491 A1* | 5/2008 | Buller et al. | 136/249 |
| 2008/0178925 A1* | 7/2008 | Wu et al. | 219/121.69 |
| 2009/0272429 A1* | 11/2009 | Lu et al. | 136/252 |
| 2010/0059109 A1* | 3/2010 | Nakayashiki et al. | 136/255 |
| 2011/0126894 A1* | 6/2011 | Nishimiya et al. | 136/255 |
| 2011/0203630 A1* | 8/2011 | Takano et al. | 136/244 |

FOREIGN PATENT DOCUMENTS

| | | | |
|---|---|---|---|
| JP | 10-258385 A | * | 9/1998 |
| JP | 2002-261308 | | 9/2002 |
| JP | 2003-273383 | | 9/2003 |
| JP | 2005-99858 A | * | 4/2005 |
| JP | 2006-080205 | | 3/2006 |
| JP | 2006-110587 | | 4/2006 |
| JP | 2006-313872 A | * | 11/2006 |

OTHER PUBLICATIONS

Machine translation of Japan Patent No. 2006-313,872, Nov. 2013.*

State Intellectual Property Office of People'S Republic of China, "The Second Office Action for CN 200980147736.9", May 6, 2013.

* cited by examiner

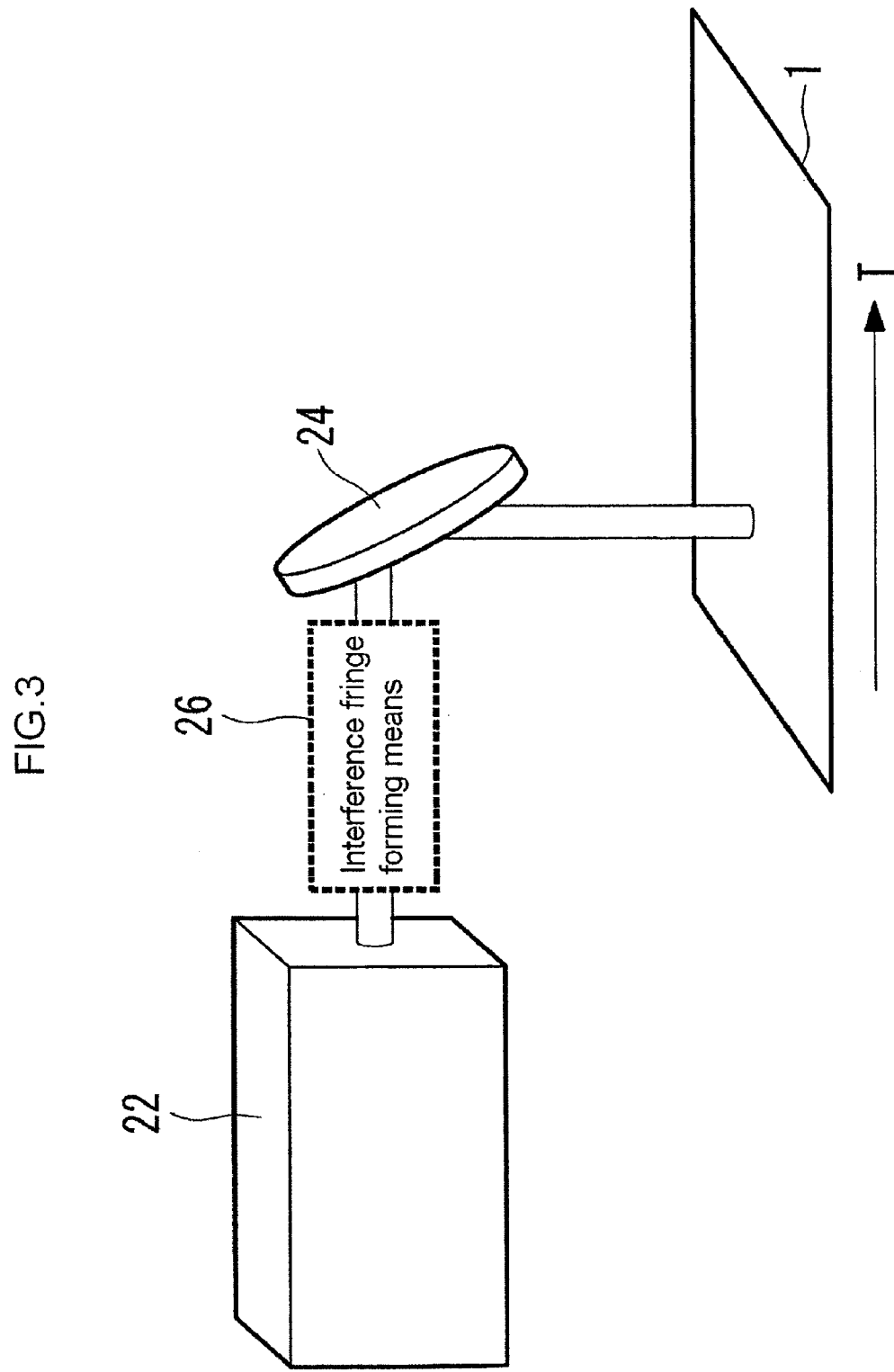

PROCESSING DEPTH
ALONG LINE A-A

PROCESSING DEPTH

PROCESSING DEPTH

METHOD FOR MANUFACTURING PHOTOELECTRIC-CONVERSION-DEVICE, DEVICE FOR PHOTOELECTRIC-CONVERSION-DEVICE MANUFACTURING DEVICE, AND PHOTOELECTRIC CONVERSION DEVICE

RELATED APPLICATIONS

The present application is National Phase of International Application No. PCT/JP2009/064745 filed Aug. 25, 2009, the disclosure of which is hereby incorporated by reference herein in its entirety.

TECHNICAL FIELD

The present invention relates to a method for manufacturing a photoelectric-conversion-device, a device for a photoelectric-conversion-device manufacturing device, and a photoelectric conversion device and, in particular, to groove processing on a thin film constituting a photoelectric conversion device.

BACKGROUND ART

In a known conventional structure, a plurality of photoelectric conversion layers are laminated in order to improve the photoelectric conversion efficiency of a thin-film solar cell (photoelectric conversion device). For example, in a known tandem solar cell, an amorphous silicon layer and a microcrystalline silicon layer are laminated. This tandem solar cell is manufactured when thin films, such as a transparent electrode, the amorphous silicon layer, the microcrystalline silicon layer, and a back electrode, are sequentially laminated on a light transmissive substrate. There is a known technology for further improving the photoelectric conversion efficiency, in which an electrically and optically connected intermediate contact layer (thin film) is provided between the amorphous silicon layer and the microcrystalline silicon layer to reflect part of incident light.

In this tandem solar cell, a plurality of photoelectric conversion cells are serially connected to achieve higher voltage to obtain a desired voltage. When the plurality of photoelectric conversion cells are serially connected, a connecting groove that passes through the amorphous silicon layer, the intermediate contact layer, and the microcrystalline silicon layer is formed and is filled with the back electrode, thereby connecting the back electrode and the transparent electrode.

On the other hand, since the intermediate contact layer has electrical conductivity, when it is electrically connected to the connecting groove filled with the back electrode, current produced in the amorphous silicon layer or the microcrystalline silicon layer leaks into the connecting groove via the intermediate contact layer.

Thus, various technologies have been proposed to prevent current leakage from the intermediate contact layer to the connecting groove by separating the intermediate contact layer through laser processing (see PTL 1 and PTL 2).

CITATION LIST

Patent Literature

{PTL 1} Japanese Unexamined Patent Application, Publication No. 2002-261308
{PTL 2} Japanese Unexamined Patent Application, Publication No. 2003-273383

SUMMARY OF INVENTION

Technical Problem

To form a groove continuous in one direction on a thin film through laser processing, a plurality of irradiated areas 14 are formed using a pulsed laser, for example, such that adjacent irradiated areas 14 are partially overlapped, to form a groove continuous in a linking manner, as shown in FIG. 12A. A diameter D0 of each irradiated area 14 corresponds to the diameter of a beam focused and radiated onto the film surface. In the figure, reference symbol B0 indicates an overlapping width between the adjacent irradiated areas 14.

However, a laser unavoidably produces a laser-intensity distribution in each irradiated area 14 corresponding to the laser diameter D0. Specifically, as shown in FIG. 12B, a Gaussian-distribution-laser-intensity distribution is produced, in which the intensity is highest at the center of the irradiated area and is lower at the circumference thereof. Therefore, a processed groove has a groove depth corresponding to the intensity distribution formed in the whole irradiated area 14. In other words, as shown in FIG. 12B, at least a groove-depth distribution corresponding to an energy-density difference dp is produced. Further, the transparent electrode and the intermediate contact layer have an uneven texture shape in order to improve the reflectance and the absorptance in the amorphous silicon layer and the crystal line silicon layer. In these circumstances, it is difficult to control a desired groove depth. Therefore, there is a problem in that sometimes a groove having a small depth is formed, which does not cut the thin film sufficiently, and sometimes a groove having a large depth greater than necessary is formed.

Furthermore, there is a problem in that a depth distribution in which a small depth and a large depth appear repeatedly in a processing direction (horizontal direction in the figure) is produced because the processed groove is continuous in a linking manner, as shown in FIG. 12A.

Note that, in the figure, reference symbol L0 indicates the length of an area that is not overlapped with adjacent irradiated areas 14, in the processing direction.

On the other hand, when the intermediate contact layer and the amorphous silicon layer are irradiated with a laser so as to separate the intermediate contact layer, the thermal energy of the laser is absorbed in the amorphous silicon layer, and the amorphous silicon layer is melted and ablated together with the intermediate contact layer, thereby forming an intermediate-contact-layer separating groove. In forming the intermediate-contact-layer separating groove, the melted amorphous silicon layer is recrystallized on a wall portion (including a bottom wall) of the intermediate-contact-layer separating groove. It is considered that, in this recrystallized region, the resistance is reduced because the original amorphous silicon has been altered. The recrystallized region, in which the resistance is reduced, has a small effect on separating the intermediate contact layer from a connecting portion between the transparent electrode and the back electrode and serves as a new current leakage path, thus lowering the cell performance.

Therefore, in order to prevent the recrystallized region from serving as a current leakage path, it is required to appropriately control the position of the recrystallized region. Specifically, it is necessary to accurately control the termination position (groove depth) of the intermediate-contact-layer separating groove.

The present invention has been made in view of these circumstances, and an object thereof is to provide a processed-groove structure capable of preventing current leakage in a film-thickness direction, and a method for a manufacturing photoelectric-conversion-device, a device for a manufacturing photoelectric-conversion-device, and a photoelectric conversion device, capable of controlling the groove depth of a processed groove at a desired value.

Solution to Problem

In order to solve the above-described problems, the method for manufacturing the photoelectric-conversion-device, the device for manufacturing the photoelectric-conversion-device, and the photoelectric conversion device of the present invention employ the following solutions.

Specifically, according to an aspect of the present invention, there is provided a method for manufacturing a photoelectric-conversion-device including a groove forming step of irradiating a thin film constituting a photoelectric conversion device with a laser and of moving the laser relative to the thin film, thereby forming a processed groove in a predetermined scanning direction, in which, in the groove forming step, interference fringes arranged in parallel in one direction are formed in an irradiated area corresponding to a beam diameter of the laser, and the laser is relatively moved such that the interference fringes are joined in the scanning direction.

In the irradiated area corresponding to the beam diameter of the laser, if the interference fringes are not formed unlike the present invention, a laser-intensity distribution in which the intensity is highest at the center and is lower at the circumference is produced. When the laser-intensity distribution is produced in the whole irradiated area in this way, it is difficult to realize a desired groove depth.

Thus, in the above-described aspect, the interference fringes are formed in the irradiated area. The interference fringes are formed of a ply of bright areas and dark area arranged in parallel in one direction. The laser intensity distribution in one of the bright areas constituting the interference fringes is relatively small compared with the laser-intensity distribution in the whole irradiated area. The laser intensity is adjusted for a predetermined bright area having a relatively small laser-intensity distribution to determine a groove depth, thus forming a processed groove with a small groove-depth distribution. As a result, it is possible to accurately form a groove having a desired groove depth.

When the interference fringes are joined in the scanning direction, continuous processed grooves are formed.

As the laser, a pulsed laser is preferably used, and, more specifically, a picosecond laser or a nanosecond laser is used.

As a thin film on which a groove is formed with the laser, an intermediate contact layer of a tandem-structured (or triple-structured) photoelectric conversion device is mainly used; however, the thin film is not limited thereto in the above-described aspect, and for example, an amorphous silicon layer, a microcrystalline silicon layer, a transparent conductive film, a back electrode, or the like can be used, and the present invention can also be used for forming an insulating groove in a module termination portion.

Furthermore, the method for manufacturing the photoelectric-conversion-device according to the aspect of the present invention further includes a first-photoelectric conversion-layer forming step of forming a first photoelectric conversion layer formed mainly of silicon; an intermediate-contact-layer forming step of forming, on the first photoelectric conversion layer, an intermediate contact layer that is electrically and optically connected to the first photoelectric conversion layer; an intermediate-contact-layer separating step of removing the intermediate contact layer through laser irradiation to form an intermediate-contact-layer separating groove that reaches the first photoelectric conversion layer, thereby separating the intermediate contact layer; and a second-photoelectric-conversion-layer forming step of forming, on the intermediate contact layer and in the intermediate-contact-layer separating groove, a second Photoelectric conversion, layer that is electrically and optically connected to the intermediate contact layer and that is formed mainly of silicon, in which the groove forming step is performed as the intermediate-contact-layer separating step.

Since the intermediate-contact-layer separating groove is formed in the intermediate contact layer through the above-described groove forming step, the intermediate-contact-layer separating groove having a desired depth can be obtained. Thus, the path of a current flowing in the film-surface direction of the intermediate contact layer can be reliably cut.

As the first photoelectric conversion layer, an amorphous silicon layer is preferably used. As the second photoelectric conversion layer, a microcrystalline silicon layer is used. As the intermediate contact layer, GZO (Ga-doped ZnO) is preferably used.

Furthermore, in the method for manufacturing the photoelectric-conversion-device according to the aspect of the present invention, the intermediate-contact-layer separating groove is terminated at a position in the first photoelectric conversion layer.

The intermediate-contact-layer separating groove is terminated at a position in the first photoelectric conversion layer and is prevented from reaching an electrode connected to the first photoelectric conversion layer (or from reaching another intermediate contact layer in a case of a triple structure). As a result, even if a recrystallized region is formed in a wall portion of the separating groove, since the recrystallized region is not physically connected to the electrode (or another intermediate contact layer), the intermediate contact layer and the electrode are not electrically connected.

In this way, it is preferable that the intermediate-contact-layer separating groove be terminated at a position where the recrystallized region is not brought into contact with the electrode connected to the first photoelectric conversion layer (or with another intermediate contact layer) and that the intermediate-contact-layer separating groove have sufficient depth to cut at least the n-layer or the p-layer of the first photoelectric conversion layer connected to the intermediate contact layer. By cutting the n-layer or the player, it is possible to avoid a situation in which dopant contained in the n-layer or the p-layer is incorporated in the recrystallized region to increase the conductivity of the recrystallized region.

Furthermore, in the method for manufacturing the photoelectric-conversion-device according to the aspect of the present invention, the laser is a pulsed laser; and, in the groove forming step, when the processed groove is continuously formed by partially overlapping a plurality of the irradiated areas irradiated with the pulsed laser, adjacent irradiated areas are overlapped such that a plurality of bright areas of the interference fringes are continuous.

When a pulsed laser is used as the laser, irradiated areas irradiated with the pulsed laser are intermittently formed. The intermittently-formed irradiated areas are partially overlapped, thereby forming continuous processed grooves.

When adjacent irradiated areas are overlapped, a partially-overlapped area is adjusted such that a plurality of bright areas are continuous. As a result, since processed grooves are formed by the plurality of continuous bright areas, the thin film (for example, the intermediate-contact-layer can be reliably cut, compared with a processed groove formed by only one bright area.

The overlapped area can be adjusted by adjusting the speed of the relative movement of the thin film and the laser or by adjusting the pulse intervals of the pulsed laser.

When the bright areas have different groove depths, the laser power is adjusted such that a specific bright area has a desired depth.

In the present invention, the "bright areas" of the interference fringes mean areas where the laser intensity is enhanced by interference, in the interference fringes, and are opposite to dark areas where the laser intensity is weakened by interference.

In the method for manufacturing the photoelectric-conversion-device according to the aspect of the present invention, the irradiated area has a substantially rectangular shape; and, in the groove forming step, one side of the irradiated area, having the rectangular shape, is partially overlapped with one side of the irradiated area adjacent thereto.

Since one side of the substantially-rectangular irradiated area is overlapped with one side of the substantially-rectangular irradiated area adjacent thereto, they can be overlapped along a wide range in a direction, where the overlapped sides extend, compared with a case where the circular irradiated areas are overlapped. Thus, the overlapping width in the scanning direction, which is necessary to make a plurality of bright areas continuous, can be narrower than a case where the circular irradiated areas are overlapped. Therefore, since the movement distance in the scanning direction can be increased by as much as the overlapping width between the irradiated areas is narrowed, the groove forming step can be shortened. When the overlapping width between the irradiated areas is narrow, an area to be irradiated with a laser a plurality of times is narrowed, thereby suppressing damage to the thin film in this overlapped area as much as possible.

To form the substantially-rectangular irradiated area, a method in which laser light is made to pass through an opening having a rectangular hole that cuts off circumferential portions of a circular laser in cross-section, or a method using an optical element for modifying the beam cross-section shape, such as a kaleidoscope, can be used, for example.

By adjusting the size of the overlapped area between adjacent substantially-rectangular irradiated areas, more bright, areas can be formed in a continuous manner, compared with a case where the circular irradiated areas.

The substantially rectangular shape does not intend to mean a rectangular shape formed to have sharp corner portions, and corner portions of the substantially rectangular shape may be rounded. In short, any shape can be used as long as the shape is formed to have one side that is overlapped with one side of an adjacent irradiated area.

In the method for manufacturing the photoelectric-conversion-device according to the aspect of the present invention, the thin film is irradiated with the laser after an intensity distribution of the laser in the irradiated area is equalized.

Since the thin film is irradiated with the laser after the intensity distribution of the laser in the irradiated area is equalized, the laser intensities in the respective bright areas constituting the interference fringes can be made equal. Thus, the groove depths in the bright areas can be made equal, thereby realizing highly-reliable groove processing. Furthermore, it is possible to avoid, a situation in which the laser intensity is high only at a predetermined bright area, and excessive processing is performed.

To equalize the intensity distribution of the laser in the irradiated area, a method of lengthening the focal length of an objective lens or a method using an optical element, such as a homogenizer (kaleidoscope such as a rod integrator), can be used, for example.

In the method for manufacturing the photoelectric-conversion-device according to the aspect of the present invention, the groove forming step is performed with a pulsed laser having a pulse width of not less than 10 ps and not more than 750 ps.

Since the pulsed laser having a pulse width of not less than 10 ps and not more than 750 ps, is used, thermal energy can be imparted to the thin film (for example, the first photoelectric conversion layer) in extremely short time intervals. Specifically, thermal diffusion in which input thermal energy is absorbed and diffused in the thin film can be suppressed to a low level, compared with a conventional pulsed laser having a nanosecond pulse width. Thus, it is possible to input sufficient, thermal energy to the vicinity of the wall portion of the processed groove (for example, the intermediate-contact-layer separating groove), to fully use the energy for groove processing, and to form the processed groove with a desired depth even in the vicinities of the edges of the processed groove.

The method for manufacturing the photoelectric conversion-device according to the aspect of the present invention further includes, before the first-optoelectric-conversion-layer forming step, a substrate-side-electrode forming step of forming a substrate-side electrode on a substrate, and a substrate-side-electrode-separating-groove forming step of forming a substrate-side-electrode separating groove by removing the substrate-side electrode; and, after the second-photoelectric-conversion-layer forming step, a connecting-groove forming step of removing the second photoelectric conversion layer, the intermediate contact layer, and the first photoelectric conversion layer and of forming a connecting groove that electrically connects a back electrode and the substrate-side electrode, in which the intermediate-contact-layer separating step is performed such that the intermediate-contact-layer separating groove is adjacent to and is partially overlapped with the substrate-side-electrode separating groove; and/or the connecting-groove forming step is performed such that the connecting groove is adjacent to and is partially overlapped with the intermediate-contact-layer separating groove.

The substrate-side-electrode separating groove (for example, the transparent conductive film), the intermediate-contact-layer separating groove, and the connecting groove are formed adjacent to each other in this order. A region from the substrate-side-electrode separating groove to the connecting groove via the intermediate-contact-layer separating groove (to be precise, the distance to an inter stage separating groove that is formed further outside of the connecting groove) is a region (inactive power-generation region) that does not contribute to power generation, as the photoelectric conversion device. In the above-described aspect, the intermediate-contact-layer separating groove Is made adjacent to and partially overlapped with the substrate-side-electrode separating groove and/or the connecting groove. Thus, the inactive power-generation region can be narrowed, and the power-generating capacity with respect to the power-generating area can be improved.

In the above-described aspect, since a plurality of grooves are formed as the intermediate-contact-layer separating groove, even when the intermediate-contact-layer separating groove is partially overlapped with the substrate-side-electrode separating groove and/or the connecting groove, only grooves that are located outward, among the plurality of grooves formed as the intermediate-contact-layer separating groove, are overlapped, and a groove that is located at the center is not overlapped. Therefore, the intermediate-contact-layer separating groove maintains its function. Furthermore, of the intermediate-contact-layer separating groove, the grooves that are located outward have small processing depths because the energy density is generally small in processing, and therefore, they do not reach the substrate-side electrode.

Furthermore, according to another aspect of the present invention, there is provided device for manufacturing photoelectric-conversion-device including: a laser oscillator that irradiates a thin film constituting a photoelectric conversion device with a laser; and transporting means that moves the laser relative to the thin film to form a processed groove in a predetermined scanning direction, in which interference-fringe forming means is further provided that forms interference fringes arranged in parallel in one direction in an irradiated area corresponding to a beam diameter of the laser; and the transporting means relatively moves the laser such that the interference fringes are joined in the scanning direction.

In the irradiated area corresponding to the beam diameter of the laser, the laser-intensity distribution in which the intensity is the highest at the center and is lower at the circumference is produced. When the laser-intensity distribution is produced in the whole irradiated area in this way, it is difficult, to realize a desired groove depth.

Thus, in the above-described aspect, the interference fringes are formed in the irradiated area by the interference-fringe forming means. The interference fringes are constituted by a plurality of bright areas arranged in parallel in one direction. The laser-intensity distribution in one of the bright areas constituting the interference fringes is relatively small compared with the laser-intensity distribution in the whole irradiated area. The laser intensity is adjusted for a predetermined bright area having a relatively small laser-intensity distribution to determine a groove depth, thus forming a processed groove with a small groove-depth distribution. As a result, it is possible to accurately form a groove having a desired groove depth.

Then, the transporting means performs relative movement such that the interference fringes are joined in the scanning direction, thereby forming continuous processed grooves.

As the laser, a pulsed laser is preferably used, and, more specifically, a picosecond laser or a nanosecond laser is used.

As the thin film on which a groove is formed with the laser, the intermediate contact layer of a tandem-structured (or triple-structured) photoelectric conversion device is mainly used; however, the present invention is not limited thereto, and, for example, the present invention can be used for groove formation on an amorphous silicon layer, a microcrystalline silicon layer, a transparent conductive film, a back electrode, or the like.

Furthermore, the device for manufacturing the photoelectric-conversion-device according to the other aspect of the present invention further includes irradiated-area-shape modifying means for modifying the shape of the irradiated area to be substantially rectangular, in which the transporting means relatively moves the laser such that one side of the irradiated area, having the rectangular shape, is partially overlapped with one side of the irradiated area adjacent thereto.

Since one side of the substantially-rectangular irradiated area is overlapped with one side of the substantially-rectangular irradiated area adjacent thereto, they can be overlapped along a wide range in a direction where the overlapped sides extend, compared with a case where the circular irradiated areas are overlapped. Thus, the overlapping width in the scanning direction, which is necessary to make the plurality of bright areas continuous, can be narrower than a case where the circular irradiated areas are overlapped. Therefore, since the movement distance in the scanning direction can be increased by as much as the overlapping width between the irradiated areas is narrowed, the groove forming step can be shortened. When the overlapping width between the irradiated areas is narrow, an area to be irradiated with a laser a plurality of times is narrowed, thereby suppressing damage to the thin film in this overlapped area as much as possible.

As the irradiated-area-shape modifying means for modifying the shape of the irradiated area to substantially rectangular, a method in which laser light is made to pass through an opening having a rectangular hole that cuts off circumferential portions of a circular laser in cross-section or a method using an optical element for modifying the beam cross-section shape, such as a kaleidoscope, can be used, for example.

By adjusting the overlapped area between adjacent substantially-rectangular irradiated areas with the transporting means, more bright areas can be formed in a continuous manner, compared with a case where the circular irradiated areas are overlapped.

The substantially rectangular shape does not intend to mean a rectangular shape formed to have sharp corner portions, and corner portions of the substantially rectangular shape may be rounded, in short, any shape can be used as long as the shape is formed to have one side that is overlapped with one side of an adjacent irradiated area.

Furthermore, the device for manufacturing the photoelectric-conversion-device according to the other aspect of the present invention further includes laser-intensity-distribution equalizing means for equalizing an intensity distribution of the laser in the irradiated area.

The intensity distribution of the laser in the irradiated area is equalized by the laser-intensity-distribution equalizing means. Then, when the thin film is irradiated with the laser, the laser intensities in the respective bright areas constituting the interference fringes can be made equal. Thus, the groove depths in the bright areas can be made equal, thereby realizing highly-reliable groove processing. Furthermore, it is possible to avoid a situation in which the laser intensity is high only at a predetermined bright area, and excessive processing is performed.

As the laser-intensity-distribution equalizing means, an optical arrangement for lengthening the focal length of an objective lens or an optical element, such as a homogenizer (kaleidoscope such as a rod integrator), can be used, for example.

According to still another aspect of the present invention, there is provided a photoelectric conversion device in which a plurality of thin films are laminated, and a processed groove is formed on one of the thin films in one direction through laser irradiation, in which the processed groove includes a plurality of grooves that are arranged in parallel in the one direction in an irradiated area corresponding to a be diameter of the laser.

Since a plurality of grooves arranged in parallel in one direction are formed in the irradiated area corresponding to the beam diameter of the laser, the thin film can be more reliably cut.

The plurality of grooves can be obtained by forming the interference fringes in the irradiated area, for example.

As the laser, a pulsed laser is preferably used, and, more specifically, a picosecond laser or a nanosecond laser is used.

As the thin film on which a groove is formed with the laser, the intermediate contact layer of a tandem-structured (or triple-structured) photoelectric conversion device is mainly used; however, the present invention is not limited thereto, and, for example, the present invention can be used for groove formation on an amorphous silicon layer, a microcrystalline silicon layer, a transparent conductive film, a back electrode, or the like.

Furthermore, according to still another aspect of the present invention, there is provided a photoelectric conversion, device including: a substrate; a substrate-side electrode that is formed on the substrate; a substrate-side-electrode separating groove that separates the substrate-side electrode; a first photoelectric conversion layer that is formed on the substrate-side electrode and in the substrate-side-electrode separating groove and that is formed mainly of silicon; an intermediate contact layer that is formed on the first photoelectric conversion layer and that is electrically and optically connected to the first photoelectric conversion layer; an intermediate-contact-layer separating groove that separates the intermediate contact layer and that is formed so as to be adjacent to the substrate-side-electrode separating groove; a second photoelectric conversion layer that is formed on the intermediate contact layer and in the intermediate-contact-layer separating groove, that is electrically and optically connected to the intermediate contact layer, and that is formed mainly of silicon; and a connecting groove that separates the second photoelectric conversion layer, the intermediate contact layer, and the first photoelectric conversion layer, that is formed so as to be adjacent to the intermediate-contact-layer separating groove, and that electrically connects a back-side electrode and the substrate-side electrode, the substrate-side-electrode separating groove, the intermediate-contact-layer separating groove, and the connecting groove being formed in parallel in this order, in which the intermediate-contact-layer separating groove corresponds to the processed groove; the intermediate-contact layer separating groove is adjacent to and is partially overlapped with the substrate-side-electrode separating groove; and/or the intermediate-contact-layer separating groove is adjacent to and is partially overlapped with the connecting groove.

The substrate-side-electrode separating groove (for example, the transparent conductive film), the intermediate-contact-layer separating groove, and the connecting groove are formed adjacent to each other in this order. A region from the substrate-side-electrode separating groove to the connecting groove via the intermediate-contact-layer separating groove (to be precise, the distance to an inter stage separating groove that is formed further outside of the connecting groove) is a region (inactive power-generation region) that does not contribute to power generation, as the photoelectric conversion device. In the above-described aspect, the intermediate-contact-layer separating groove is made adjacent to and partially overlapped with the substrate-side-electrode separating groove and/or the connecting groove. Thus, the inactive power-generation region can be narrowed, and the power-generating capacity with respect to the power generating area can be improved.

In the above-described aspect, since a plurality of grooves are formed as the intermediate-contact-layer separating groove, even when the intermediate-contact-layer separating groove is partially overlapped with the substrate-side-electrode separating groove and/or the connecting groove, only grooves that are located outward, among the plurality of grooves formed as the intermediate-contact-layer separating groove, are overlapped, and a groove that is located at the center is not overlapped. Therefore, the intermediate-contact-layer separating groove maintains its function. Furthermore, of the intermediate-contact-layer separating groove, the grooves that are located outward have small processing depths because the energy density is generally small in processing, and therefore, they do not reach the substrate-side electrode.

Advantageous Effects of Invention

According to the present invention, the following effects are afforded.

Interference fringes are formed in an irradiated area to obtain a plurality of bright areas arranged in parallel in one direction. Since the laser-intensity distribution in each of the bright areas constituting the interference fringes is relatively small compared with the laser intensity distribution in the whole irradiated area, the groove-depth distribution of a processed groove corresponding to one of the bright areas of the interference fringes is also small. Therefore, the laser intensity is adjusted for a predetermined bright area to determine the groove depth to obtain a processed groove with a small groove-depth distribution, thereby making it possible to accurately form a groove having the desired groove depth.

Since a separating groove having the desired depth with a small depth distribution can be formed when the intermediate contact layer is separated, it is possible to reliably cut the intermediate contact layer and to suppress current leakage occurring when the intermediate contact layer is cut incompletely. As a result, the performance of the photoelectric conversion device is improved.

BRIEF DESCRIPTION OF DRAWINGS

FIG. 3 is a view showing, in outline, the configuration, of an optical system of an apparatus for processing the intermediate-contact-layer separating groove, in a solar-cell manufacturing device according to the first embodiment of the present invention.

DESCRIPTION OF EMBODIMENTS

Embodiments of the present invention will be described below with reference to the drawings.

First Embodiment

Figure 1:
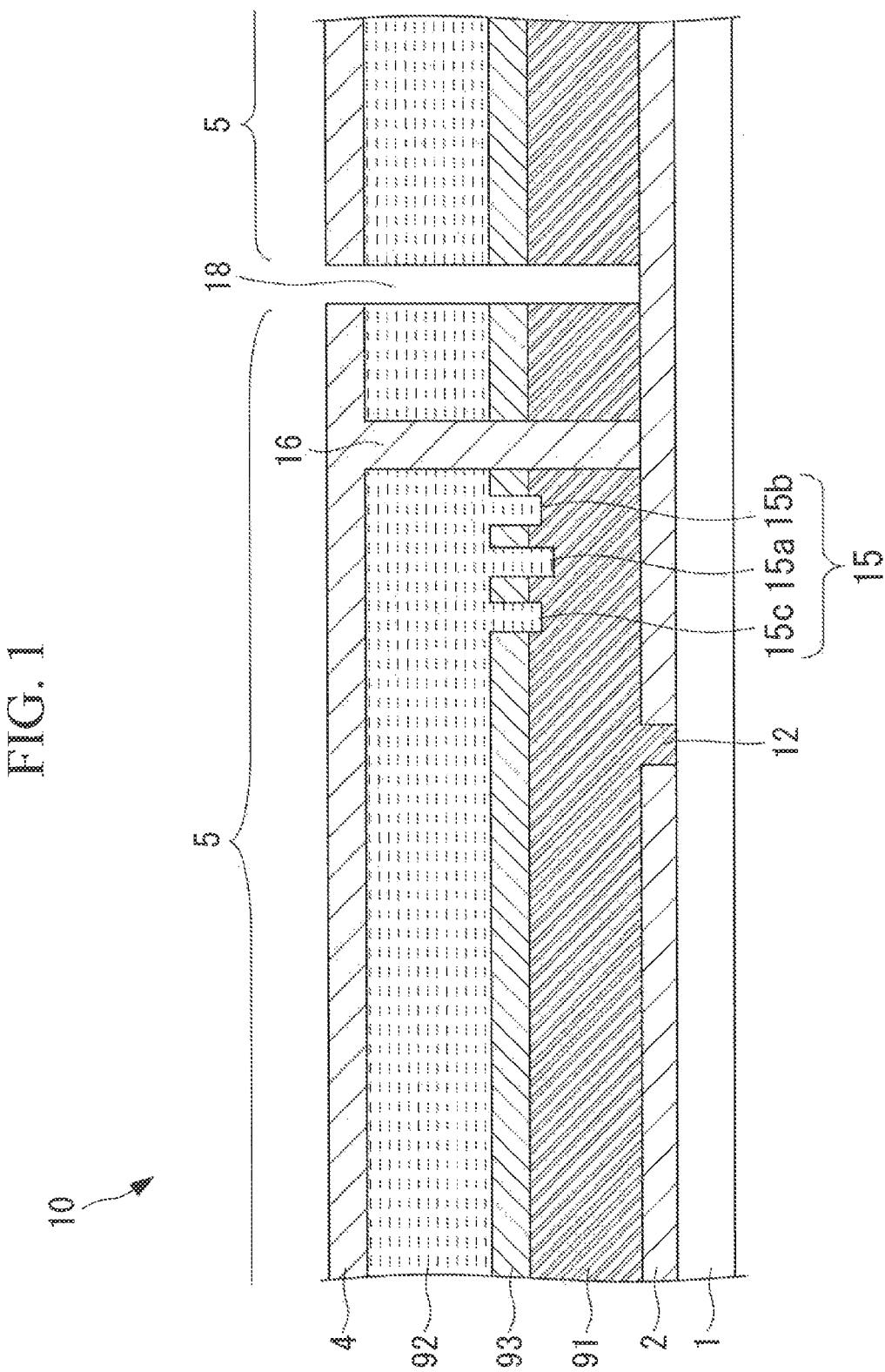
FIG. 1 is a longitudinal sectional view showing a tandem solar cell according to a first embodiment of the present invention.

FIG. 1 is a longitudinal sectional view of a tandem-type silicon thin-film solar cell (photoelectric conversion device).

A solar cell 10 includes a glass substrate 1 serving as a translucent insulating substrate, a transparent electrode layer 2, a top layer (first photoelectric conversion layer) 91, an intermediate contact layer 93, a bottom layer (second photoelectric conversion layer) 92, and a back electrode layer 4. In this embodiment, the top layer 91 is a photoelectric conversion layer mainly having an amorphous silicon semiconductor, and the bottom layer 92 is a photoelectric conversion layer mainly having a crystalline silicon semiconductor.

Here, "silicon" is a general term including silicon (Si), silicon carbide (SiC), and silicon germanium (SiGe). Further, "crystalline silicon" is intended to mean silicon other than amorphous silicon, that is, non crystalline silicon, and also includes microcrystalline silicon and polycrystalline silicon.

The thus-structured solar cell 10 of this embodiment is manufactured as described below.

As the glass substrate 1, soda float glass with an area of 1 m square or more is used. Soda float glass having a size of 1 m square or more (specifically, 1.4 m×1.1 m) and a plate thickness of 3.5 to 4.5 mm is used. It is preferable that end faces of the glass substrate 1 be subjected to a corner chamfering process or an R-chamfering process in order to avoid damage caused by thermal stress, impacts, or the like.

As the transparent electrode layer 2, a transparent electrode film composed mainly of, for example, tin oxide ($SnO_2$) is preferably used. The transparent electrode film has a film thickness of about 500 nm to 800 nm and is obtained through film-formation processing at about 500° C. using a thermal CVD apparatus. During the film-formation processing, a suitable uneven texture is formed on the surface of the transparent electrode film. As the transparent electrode layer 2, an alkali barrier film (not shown) may be inserted between the transparent electrode film and the substrate 1. The alkali barrier film is a silicon oxide film ($SiO_2$) having a film thickness of 50 nm to 150 nm, for example, and is obtained through film-formation processing at about 500° C. using a thermal CVD apparatus.

Thereafter, the glass substrate 1 is placed on an X-Y table and is irradiated with the first harmonic (1064 nm) of a YAG laser from the film surface side (upper site in the figure) of the transparent electrode layer 2. The laser power is adjusted so as to be appropriate for the processing speed, and the laser light is moved relative to the glass substrate 1, over the transparent electrode layer 2 in a direction perpendicular to the series-connection direction of power generation cells 5 (in a direction perpendicular to the plane of the figure), thus forming a transparent-electrode separating groove (substrate-side-electrode separating groove) 12. By doing so, the transparent electrode layer 2 is laser-etched in a rectangular shape with a predetermined width of about 6 mm to 15 mm.

Next, a p-layer film, an i-layer film, and an n-layer film that are each formed of an amorphous silicon thin film are sequentially formed using a plasma CVD apparatus under the following conditions: a low-pressure atmosphere of 30 to 1000 Pa and a substrate temperature of about 200° C., thus forming the top layer 91. The top layer 91 is formed on the transparent electrode layer 2 by process gas using $SiH_4$ gas and $H_2$ gas as main materials. The p-layer, the i-layer, and the n-layer are laminated in this order from the side on which sunlight is incident (from the glass substrate 1 side).

In this embodiment, the top layer 91 is constituted by the amorphous player formed mainly of B-doped amorphous SiC and having a film thickness of 10 nm to 30 nm, the amorphous i-layer formed mainly of amorphous Si and having a film thickness of 200 nm to 350 nm, and the amorphous n-layer formed manly of p-doped Si layer, in which microcrystalline Si is contained in amorphous Si, and having a film thickness of 30 nm to 50 nm. A buffer layer may be provided between the p-layer film and the i-layer film in order to improve the interfacial properties.

Next, as the intermediate contact layer 93, a GZO (Ga-doped ZnO) film is formed on the top layer 91 (intermediate-contact-layer forming step). The GZO (Ga-doped ZnO) film has a film thickness of 20 nm to 100 nm and is formed by using a sputtering apparatus. With the intermediate contact layer 93, it is possible to improve the contact properties between the top layer 91 and the bottom layer 92 and to achieve current consistency. The intermediate contact layer 93 is a semi-reflective film and realizes improved photoelectric conversion efficiency in the top layer 91 by reflecting part of light entering from the glass substrate 1

Next, the glass substrate 1 is placed on the table and is irradiated with a pulsed laser (hereinafter, referred to as "picosecond pulsed laser") having a pulse width of not less than 10 ps and not more than 750 ps from the film surface side (upper side in the figure) of the transparent electrode layer 2. With this picosecond pulsed laser, an intermediate-contact-layer separating groove 15 is formed between the transparent-electrode separating groove 12 and a connecting groove 16 (intermediate-contact-layer separating step). The intermediate-contact-layer separating groove (processed groove) 15 includes a first processed groove 15a, a second processed groove 15b, and a third processed groove 15c, the second processed groove 15b and the third processed groove 15c being located at both sides of the first processed groove 15a.

Figure 2:
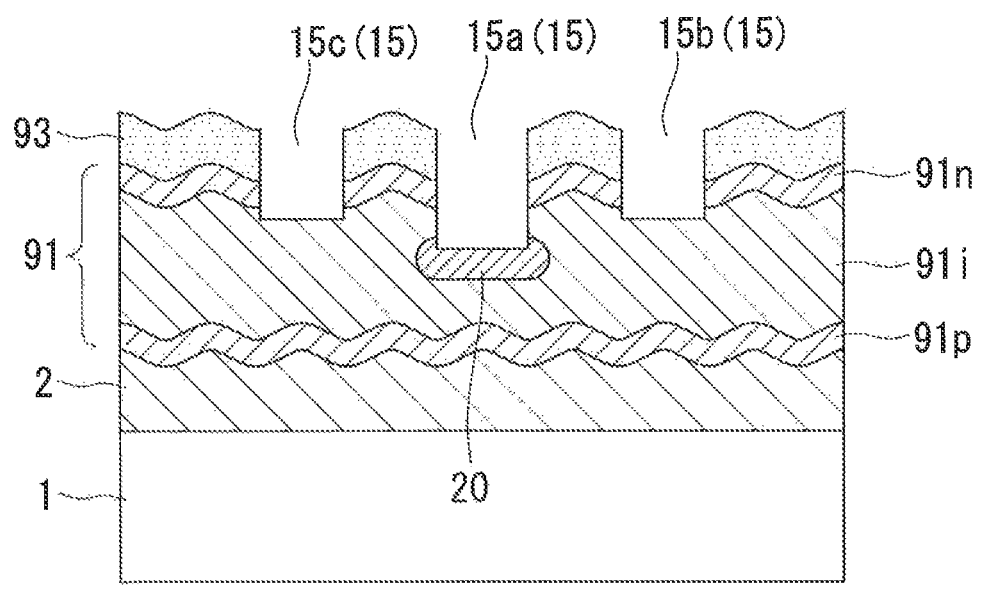
FIG. 2 is a longitudinal sectional view showing a state where an intermediate-contact-layer separating groove is formed in an intermediate-contact-layer separating step.

As shown in FIG. 2, the processed grooves 15a, 15b, and 15c are each terminated in an amorphous i-layer 91i of the top layer 91.

With the intermediate-contact-layer separating groove 15, current flowing in a film-surface direction of the Intermediate contact layer 93 can be blocked.

The intermediate-contact-layer separating step will be described later in detail.

Next, on the intermediate contact layer 93 and in the intermediate-contact-layer separating groove 15, a microcrystalline p-layer film, a microcrystalline i-layer film, and a microcrystalline n-layer film that are each formed of a microcrystalline silicon thin film are sequentially formed by using a plasma CVD apparatus under the following conditions: a low-pressure atmosphere of 3000 Pa or less, a substrate temperature of about 200° C., and a plasma generation frequency of 40 MHz to 100 MHz, thus forming the bottom layer 92 (second-photoelectric-conversion-layer forming step).

In this embodiment, the bottom layer 92 is constituted by a microcrystalline p-layer formed mainly of B-doped microcrystalline SiC and having a film thickness of 10 nm to 50 nm, a microcrystalline i-layer formed mainly of microcrystalline Si and having a film thickness of 1.2 μm to 3.0 μm, and a microcrystalline n-layer formed mainly of p-doped microcrystalline Si and having a film thickness of 20 nm to 50 nm.

When the microcrystalline silicon thin film, particularly, the microcrystalline i-layer film, is formed by using the plasma CVD method, it is preferable to set a distance d between the plasma discharge electrode and the surface of the glass substrate 1 at 3 mm to 10 mm. When it is less than 3 mm, it becomes difficult to keep the distance d constant because of the precision of individual constituent devices in a film-formation chamber compatible with large substrates, and there is a risk of the discharge becoming unstable when they get too close to each other. When it is more than 10 mm, it is difficult to achieve an adequate film-formation speed (1 mm/s or more), the plasma uniformity decreases, and the film quality is reduced due to ion bombardment.

Next, the glass substrate 1 is placed on the X-Y table and is irradiated with the second harmonic (532 cm) of a laser-diode-pumped YAG laser from the film surface side (upper side in the figure) of the bottom layer 92, as shown by the arrow in the figure. The laser power is adjusted so as to be appropriate for the processing speed, with a pulse oscillation of 10 to 20 kHz, to form the connecting groove 16 at a position about 50 to 350 μm away laterally from the transparent-electrode separating groove 12. The laser may be radiated from the glass substrate 1 side, and in this case, because the intermediate contact layer 93 and the bottom layer 92 can be etched using high-pressure vapor generated with the energy absorbed in the top layer 91, it is possible to perform laser etching processing even more stably. The position of the laser etching line is selected in consideration of the positional tolerance no as not to intersect the etching line in the previous step.

Next, as the back electrode layer 4, an Ag film/Ti film are sequentially formed by using a sputtering apparatus with a low-pressure atmosphere at about 150 to 200° C. In this embodiment, the back electrode layer 4 is formed when an Ag film having a film thickness of about 150 to 500 nm, and a Ti film having a film thickness of 10 to 20 nm, which has a high anti-corrosion effect and serves to protect the Ag film, are laminated in this order. Alternatively, the back electrode layer 4 may have a laminated structure of an Ag film and/or a Cu film having a film thickness of about 25 nm to 100 nm, and an Al film or a Ti film having a film thickness of about 15 nm to 500 nm. In order to improve the light reflectivity and reduce the contact resistance of the n-layer and the back electrode layer 4, a GZO (Ga-doped ZnO) film having a film thickness of 50 to 100 nm may be formed between the bottom layer 92 and the back electrode layer 4, using a sputtering apparatus.

Next, the glass substrate 1 is placed on the X-Y table and is irradiated with the second harmonic (532 nm) of a laser-diode-pumped YAP laser from the glass substrate 1 side (lower side in the figure). The laser light is absorbed in the top layer 91 and the bottom layer 92, and the back electrode layer 4 is removed by blasting using the high gas vapor pressure generated during this process. The laser power is adjusted such that the processing speed becomes appropriate, with a laser pulse oscillation frequency of 1 to 10 kHz, and laser etching is performed so as to form a cell dividing groove (inter-stage separating groove) 18 at a position about 250 to 400 μm away laterally from the transparent-electrode separating groove 12

After the above-described steps, a step of applying a back sheet having a high waterproofing effect v a an adhesive packing sheet, such as EVA (ethylene vinyl acetate copolymer), so as to cover the back electrode layer 4, and other steps are performed, and then, the solar cell is manufactured.

The details of the above-described intermediate-contact-layer separating step will be described below.

The laser used in this step is a picosecond pulsed laser with a pulse width of not less than 10 ps and not more than 750 ps. Specifically, a picosecond-pulsed-laser oscillator with a pulse width of 13 ps, an oscillation frequency of 10 kHz, and a beam spot diameter of 124 μm is preferably used. Typical examples of the picosecond-pulsed-laser oscillator include an Nd:YVO4 laser, a titanium-sapphire laser, and a fiber laser.

As shown in FIG. 2, the termination position (bottom portion) of the intermediate-contact-layer separating groove 15 is located in the i-layer 91i of the top layer 91. In other words, the termination position of the intermediate-contact-layer separating groove 15 is not located in an layer 91n or a p-layer 91p of the top layer 91. With this structure, even if an amorphous-silicon recrystallized region 20 is formed on a wall portion (including the bottom portion) of the intermediate-contact-layer separating groove 15, dopant in the n-layer 91n or the player 91p can be prevented from spreading to the recrystallized region 20, and a reduction in the resistance of the recrystallized region 20, caused by the dopant, can be avoided. The recrystallized region 20 can be confirmed with a transmission electron microscope or the like.

FIG. 3 shows the apparatus configuration of an optical system for processing the intermediate-contact-layer separating groove 15.

A total reflection mirror 24 is disposed between a picosecond-pulsed-laser oscillator 22 and the glass substrate 1 (more specifically, the glass substrate 1 on which the top layer 91 and the intermediate contact layer 93 have been formed). The glass substrate 1 is moved in the direction of arrow T by transporting means, such as a roller or belt conveyor not shown), and the intermediate-contact-layer separating groove 15 is formed continuously in the scanning direction T.

Interference-fringe forming means 26 is provided between the picosecond-pulsed-laser oscillator 22 and the total reflection mirror 24.

Figure 4A:
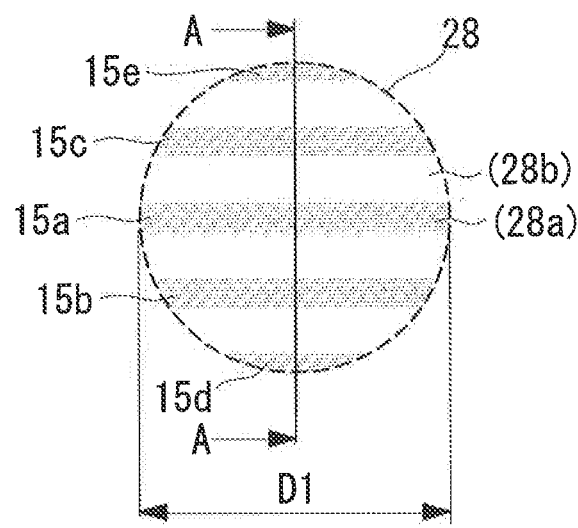
FIG. 4A shows a state where interference fringes are formed in a laser-irradiated area.
Figure 4B:
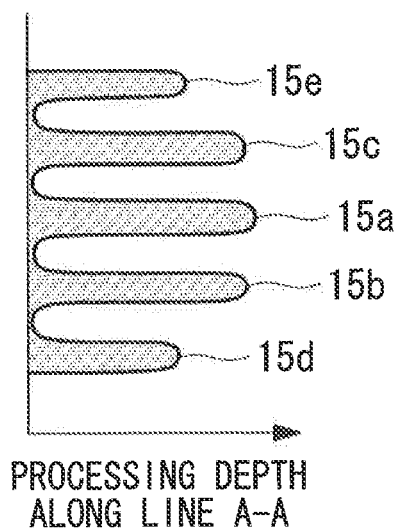
FIG. 4B shows the laser-intensity distribution of the interference fringes in the laser-irradiated area.

The interference-fringe forming means 26 forms interference fringes arranged in parallel in one direction, in an irradiated area 28 (see FIG. 4A) corresponding to a laser beam diameter D1. The interference fringes are formed of bright areas 28a and dark areas 28b. The bright areas 28a are areas where the laser intensity is enhanced by interference, and the dark areas 28b are areas where the laser intensity is weakened by interference. As shown in FIG. 4A, through one irradiation, processed grooves 15a, 15b, 15c, 15d, and 15e are formed by the bright areas 28a of the interference fringes. The areas located between the processed grooves 15a, 15b, 15c, 15d, and 15e correspond to the dark areas 28b of the interference fringes, and almost no grooves are formed there. FIG. 4B shows the processing depths formed by the interference fringes and shows that the processed grooves 15a, 15b, 15c, 15d, and 15e, having large depths, are formed at the positions corresponding to the bright areas 28a, and almost no processed grooves are formed at the positions corresponding to the dark areas 28b.

Figure 12A:
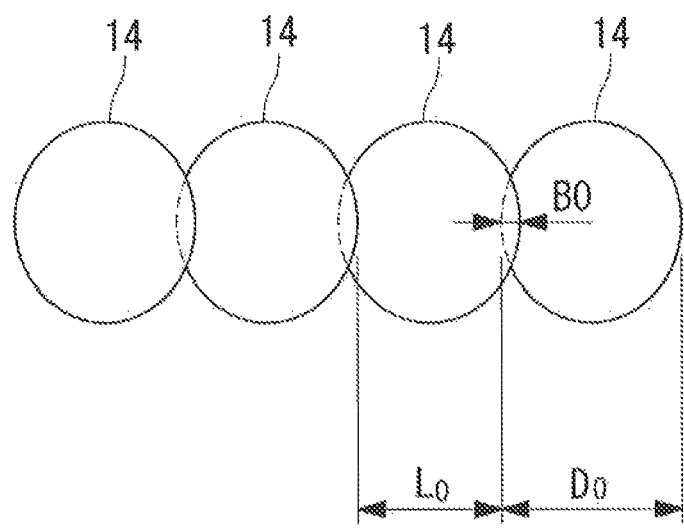
FIG. 12A is a plan view showing an overlapping state of irradiated areas when a conventional pulsed laser is used.
Figure 12B:
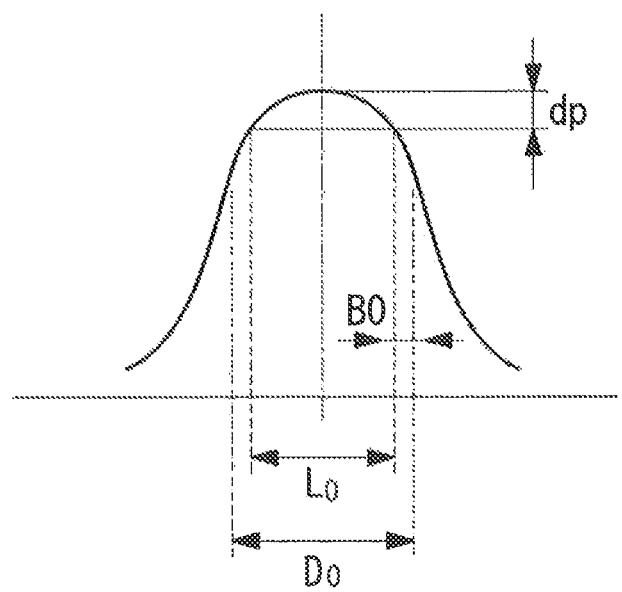
FIG. 12B is a graph showing the energy density of a conventional pulsed laser in the beam cross section.

The groove-depth distribution of each of the processed grooves 15a, 15b, 15c, 15d, and 15e is relatively small, compared with a case where interference fringes are not formed (FIG. 12B). Therefore, since the processed grooves 15 with a small depth distribution can be obtained, desired groove depths can be accurately controlled by adjusting the laser intensity.

Figure 5:
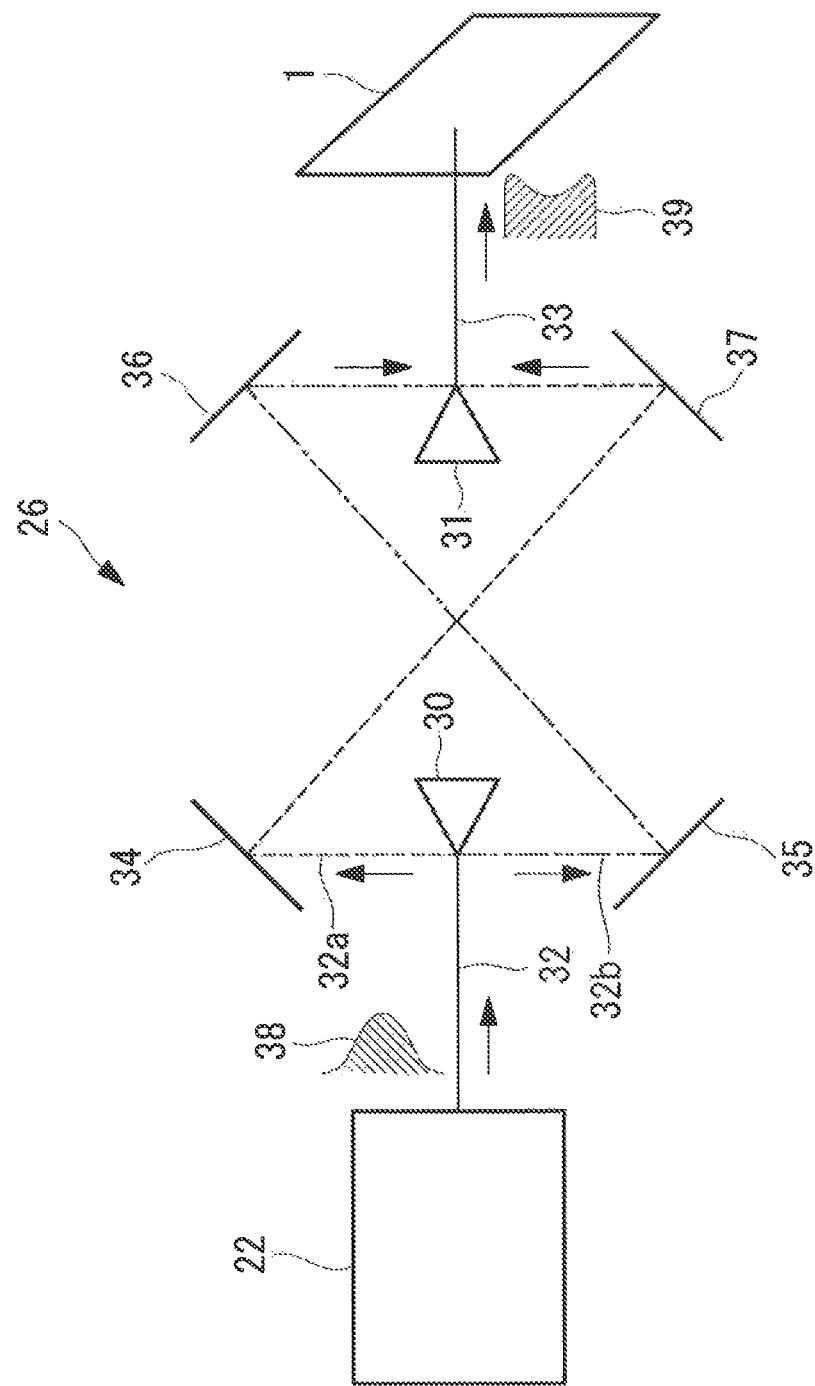
FIG. 5 is a view showing, in outline, the configuration of a homogenizer as an example of interference-fringe forming means.

FIG. 5 shows an example specific configuration of the interference-fringe forming means 26. The interference-fringe forming means 26 includes a beam splitting mirror 30 and a beam combining mirror 31 that are arranged facing each other, and total reflection mirrors 34, 35, 36, and 37 for reflecting split light. Incident laser light 32 emitted from the laser oscillator 22 and having an energy-density distribution indicated by reference numeral 33 is incident on the beam splitting mirror 30. The incident laser light 32 is split at the center of the beam splitting mirror 30 into split laser light 32a and split laser light 32b. The split laser light 32a and the split laser light 32b are reflected at the total reflection mirrors 34 and 35, respectively, and then cross. When the split laser light 32a and the split laser light 32b cross, they interfere with each other. Furthermore, when the split laser light 32a and the split laser light 32b cross, the positions thereof are switched. The split laser light 32a and the split laser light 32b are reflected at the total reflection mirrors 37 and 36, respectively, and are incident on the beam combining mirror 31. At the beam combining mirror 31, the split laser light 32a and the split laser light 32b are combined when they are superimposed. Outgoing laser light 33 obtained through superimposing and having an energy-density distribution indicated by reference numeral 39 is radiated onto the substrate 1. As described above, since the split laser light 32a and the split laser light 32b interfere with each other when they cross, interference fringes are formed in the outgoing laser light 33.

Note that the intensity distribution of the outgoing laser light 33 can also be equalized at a desired level by appropriately adjusting the optical system shown in FIG. 5. Furthermore, an equivalent optical system can also be configured by using various prisms, instead of the beam splitting mirror, the beam combining mirror, and the total reflection minors shown in FIG. 5.

Figure 6:
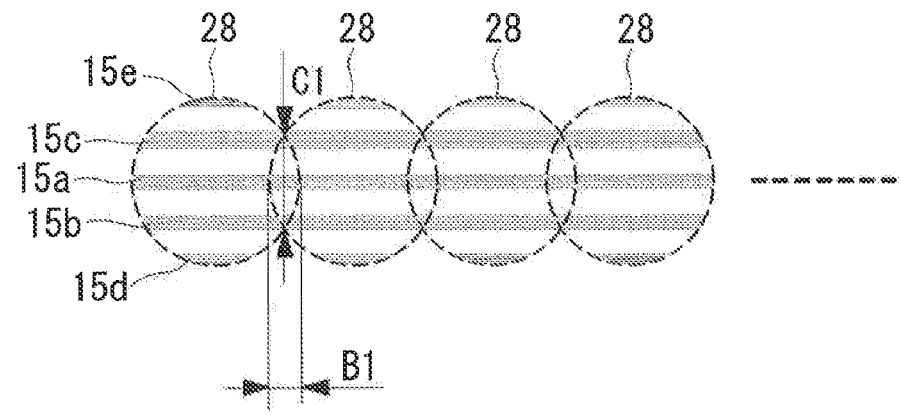
FIG. 6 is an explanatory view showing a method of forming the intermediate-contact-layer separating groove in a continuous manner.

FIG. 6 shows a method of forming the intermediate-contact-layer separating groove 15 in a continuous manner.

The respective irradiated areas 28 are partially overlapped. The horizontal direction in the figure corresponds to a direction in which the intermediate-contact-layer separating groove 15 is formed (scanning direction). An overlapping width B1 between adjacent irradiated areas 28 is determined such that the processed grooves 15 formed by the bright areas 28a are continuous. In the embodiment shown in the figure, the overlapping width B1 is determined such that the three processed grooves 15a, 15b, and 15c corresponding to three bright areas are continuous. As a result, the three processed grooves 15a, 15b, and 15c, shown in FIGS. 1 and 2, are formed so as to be continuous. Note that the processed grooves 15d and 15e that are located outermost are not continuous in the scanning direction, as shown in FIG. 6.

The overlapping width B1 can be adjusted by adjusting the speed of the relative movement of the substrate 1 and a laser or by adjusting the pulse intervals of a pulsed laser.

According to this embodiment described above, the following effects are afforded.

In the picosecond-pulsed-laser irradiated areas 28, interference fringes are formed to obtain a plurality of bright areas 28a arranged in parallel in one direction. The laser-intensity distribution in each of the bright areas 28a is relatively small compared with the laser-intensity distribution in the whole irradiated area. The laser intensity of a predetermined bright area where the laser-intensity distribution is relatively small is adjusted to determine a groove depth. As a result, the processed grooves 15a, 15b, and 15c having desired groove depths can be formed accurately.

The intermediate-contact-layer separating groove 15 is terminated at a position in the first photoelectric conversion layer and is prevented from reaching the transparent electrode layer 2 connected to the top layer 91. As a result, even if the recrystallized region 20 (see FIG. 2) is formed in a wall portion of the intermediate-contact-layer separating groove 15, since the recrystallized region 20 is not physically connected to the transparent electrode layer 2, the intermediate contact layer 93 and the transparent electrode layer 2 are not electrically connected.

In this way, it is preferable that the intermediate-contact-layer separating groove 15 be terminated at a position where the recrystallized region 20 is not brought into contact with the transparent electrode layer 2 connected to the top layer 91 and that the intermediate-contact-layer separating groove 15 have sufficient depth to cut at least the n-layer 91n of the top layer 91 connected to the intermediate contact layer 93. When the n-layer is cut in this way, it is possible to avoid a situation in which dopant contained in the n-layer is incorporated in the recrystallized region 20 to increase the conductivity of the recrystallized region.

By adjusting the overlapping width 51 when adjacent picosecond-pulsed-laser irradiated areas 28 are partially overlapped, the processed grooves 15a, 15b, and 15c corresponding to the plurality of bright areas of the interference fringes are continuous. Since the plurality of continuous processed grooves 15a, 15b, and 15c are formed, the intermediate contact layer 93 can be more reliably cut, compared with a case where a processed groove is formed by only one bright area.

When the processed grooves 15a, 15b, and 15c have different groove depths, laser power is adjusted such that the specific processed groove 15a has a desired depth. In this case, current leakage from the intermediate contact layer is mainly prevented by the specific processed groove 15a.

Since a pulsed laser used in this embodiment has a pulse width of not less than 10 ps and not more than 750 ps, it can impart thermal energy to the top layer 91 in extremely short time intervals. Specifically, since thermal diffusion in which input thermal energy is absorbed and diffused in a thin film can be suppressed to a low level, compared with a conventional pulsed laser having a nanosecond pulse width, it is possible to input sufficient thermal energy to the vicinity of the wall portion of the intermediate-contact-layer separating groove 15, to fully use the energy for groove processing, and to form the intermediate-contact-layer separating groove 15 with a desired depth.

Since it is possible to reduce the depth distribution of the intermediate-contact-layer separating groove 15 to reliably cut the intermediate contact layer 93 and to avoid any influence caused by the recrystallized region 20, performance deterioration due to current leakage is reduced, and cell performance is improved.

In this embodiment, a description has been given of a case where a picosecond laser is used; however, the present invention is not limited thereto, and another laser, for example, a nanosecond laser, can be used as long as a plurality of bright areas 28a can be formed in the irradiated area 28 by the interference fringes.

A description has been given of an example case where the intermediate contact layer 93 is used as a thin film to be processed; however, another thin film, for example, the top layer 91, the bottom layer 92, the transparent electrode layer 2, or the back electrode layer 4, may be processed.

In this embodiment, a configuration in which the substrate 1 is moved in the scanning direction T (see FIG. 3) relative to a picosecond laser is used; however, the present invention is not limited thereto, and a laser and a thin film serving as a processing target just need to be relatively moved. For example, the substrate 1 may be fixed and scanned by a laser in a processing direction.

In this embodiment, a description has been given of a case where the first processed, groove 15a located at the center has the largest groove depth; however, the present invention is not limited thereto, and the optical system may be adjusted to make the second processed groove 15b or the third processed groove 15c, located outward, have the largest groove depth.

Second Embodiment

Next, a second embodiment of the present invention will be described using FIGS. 7 and 8. The shape of an irradiated area of this embodiment differs from that of the first embodiment, and the other points are the same as those of the first embodiment. Therefore, only the differences will be described, and a description of the other points will be omitted.

Figure 7:
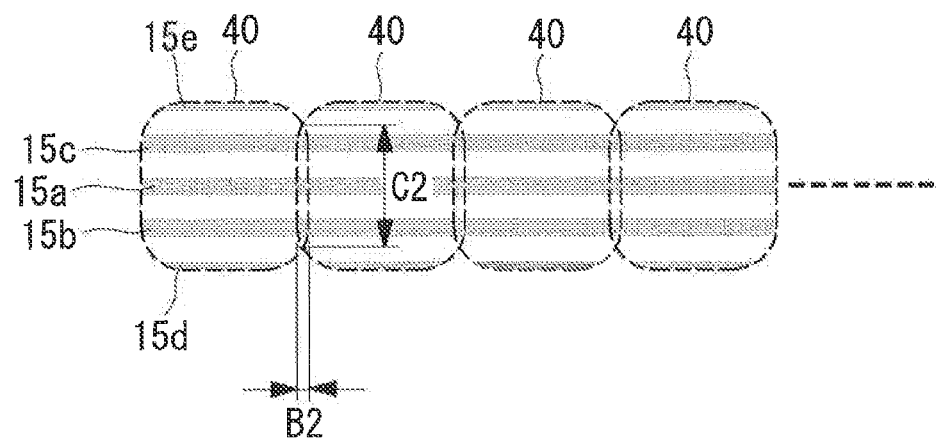
FIG. 7 is a plan view showing irradiated areas according to a second embodiment of the present invention.

FIG. 7 is a view corresponding to FIG. 6, used to describe the first embodiment. As shown in FIG. 7, an irradiated area 40 has a substantially rectangular shape.

To form the rectangular irradiated area 40, a method in which laser light is made to pass through an opening having a rectangular hole that cuts off circumferential portions of a circular laser in cross-section, or a method using a kaleidoscope can be used.

To form the intermediate-contact-layer separating groove 15, one side of the irradiated area 40 is partially overlapped with one side of an adjacent irradiated area 40, as shown in FIG. 7. In this way, since the adjacent irradiated areas 40 can be overlapped along a wide width C2 in a direction where the overlapped sides extend, an overlapping width B2 between the adjacent irradiated areas 40 can be narrowed, compared with a case where the circular irradiated areas 28 are overlapped (see a width C1), as shown in FIG. 6. Therefore, it is possible to increase the movement distance in the scanning direction and also to shorten the intermediate-contact layer separating step. Furthermore, since the overlapping width B2 (smaller than B1) between the irradiated areas 40 can be narrowed in the scanning direction, an overlapped area to be irradiated with a laser a plurality of times is reduced, thereby suppressing damage to the top layer 91 as much as possible.

Furthermore, by adjusting the overlapped area between adjacent substantially-rectangular irradiated areas, more processed grooves can be formed in a continuous manner, compared with the first embodiment, in which the irradiated areas are circular. Specifically, as shown in FIG. 8, when an overlapping width B2' (larger than B2) is set larger than the case shown in FIG. 7, the number of continuous bright area 28a can be increased, and the number of processed grooves 15 can be increased. More specifically, the five processed grooves 15a, 15b, 15c, 15d, and 15e can be formed in a continuous manner in the case shown in FIG. 8, whereas the three processed grooves 15a, 15b, and 15c are formed in a continuous manner in the case shown in FIG. 7.

Figure 8:
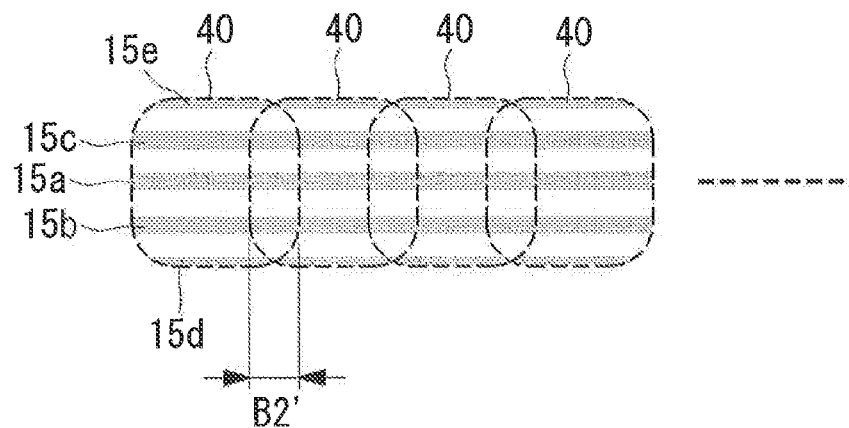
FIG. 8 is a plan view showing a modification of the irradiated areas shown in FIG. 7.

In this embodiment, the substantially rectangular shape does not intend to mean a rectangular shape formed to have sharp corner portions, and corner portions of the substantially rectangular shape may be rounded, as shown in FIGS. 7 and 8. In short, any shape can be used as long as the shape is formed to have one side that is overlapped with one side of an adjacent irradiated area Third Embodiment Next, a third embodiment of the present invention will be described using FIGS. 9A and 9B and FIG. 10. This embodiment differs from the first embodiment in that the depths of the processed grooves 15 are set almost equal. Since the other configurations are the same as those of the first embodiment, a description thereof will be omitted.

Figure 9A:
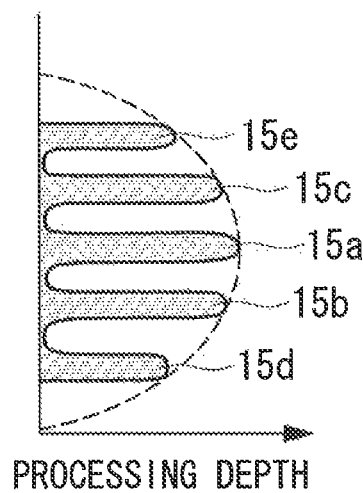
FIG. 9A is a schematic view schematically showing the depths of processed grooves and the depth distribution of the processed grooves, according to the first embodiment.
Figure 9B:
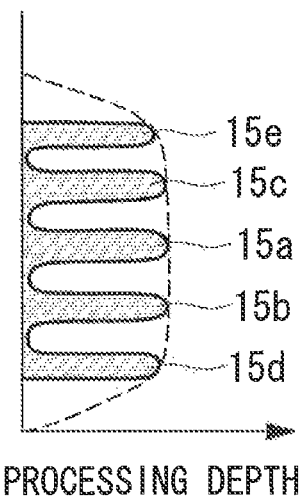
FIG. 9B is a schematic view schematically showing the depths of processed grooves and the depth distribution of the processed grooves, according to a third embodiment.

The processed grooves 15a, 15b, and 15c described in the first embodiment have different groove depths, as shown in FIG. 9A. On the other hand, in this embodiment, the processed grooves 15a, 15b, 15c, 15d, and 15e have substantially the same groove depths, as shown in FIG. 9B.

Figure 10:
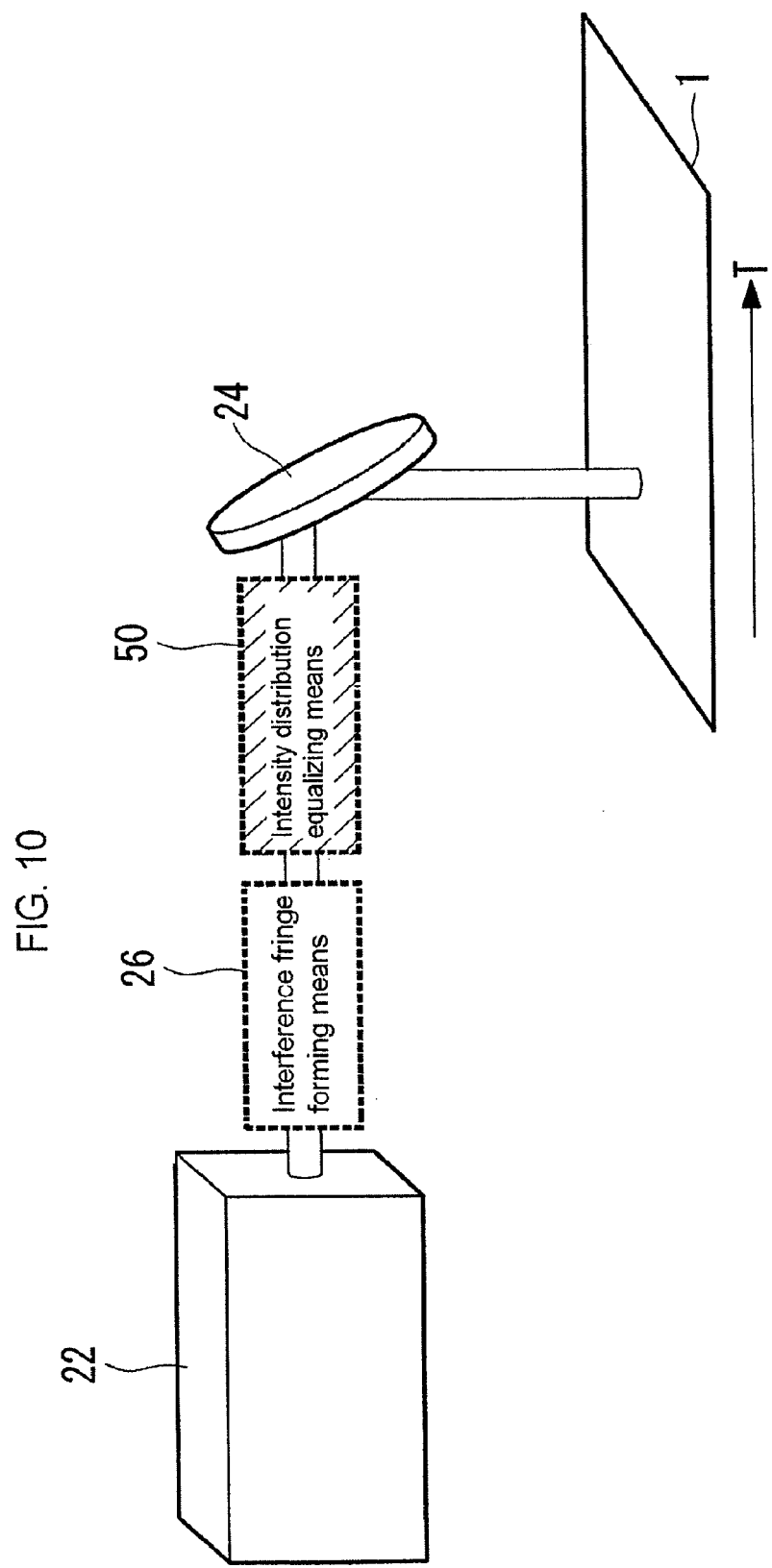
FIG. 10 is a view showing, in outline, the configuration of an optical system of an apparatus for processing an intermediate-contact-layer separating groove, in a solar-cell manufacturing device according to a third embodiment of the present invention.

To set the processed grooves 15a, 15b, 15c, 15d, and 15e to have substantially equal groove depths, the laser-intensity distribution in an irradiated area just needs to be equalized. Specifically, as shown in FIG. 10, laser-intensity-distribution equalizing means 50 for equalizing the intensity distribution of a laser light emitted from the picosecond pulsed laser oscillator 22 is disposed in the previous stage of the total reflection mirror 24. Examples of the laser-intensity-distribution equalizing means 50 include an optical system that lengthens the focal length of an objective lens, and a homogenizer (kaleidoscope such as a rod integrator).

As described above, according to this embodiment, since the intermediate contact layer 93 is irradiated with a laser after the intensity distribution in the laser-irradiated area is equalized, the laser intensities in the respective bright areas constituting the interference fringes can be made equal. Thus, the groove depths of the processed grooves 15 formed by the bright areas can be made equal, thereby realizing highly-reliable groove processing.

Furthermore, it is possible to avoid a situation in which the laser intensity is high only at a predetermined bright area (specifically, the processed groove 15a of FIG. 9A), and excessive processing is performed.

Fourth Embodiment

Next, a fourth embodiment of the present invention will be described using FIGS. 11A and 11B. In this embodiment, spaces between the transparent-electrode separating groove 12, the intermediate-contact-layer separating groove 15, and the connecting groove 16 are different from those in the first embodiment. Since the other configurations are the same as those of the first embodiment, a description thereof will be omitted.

Figure 11A:
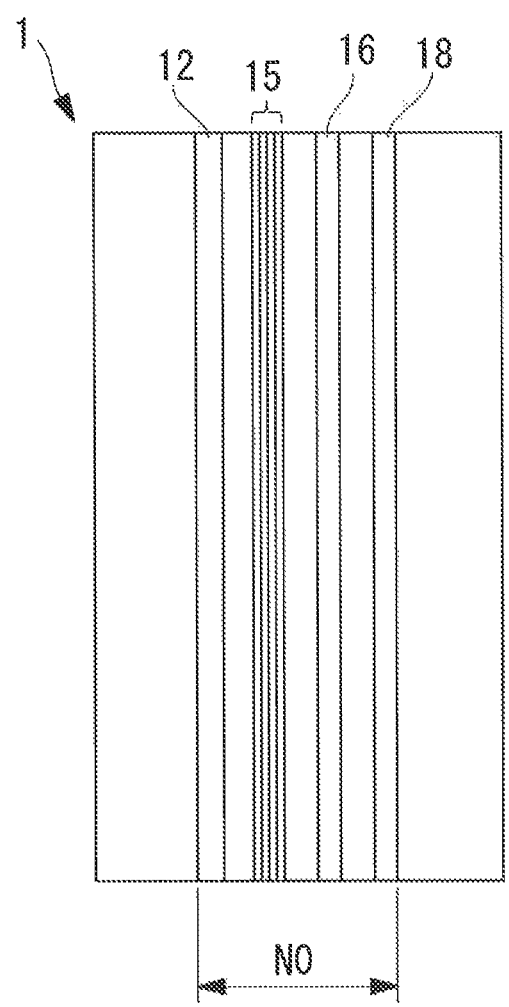
FIG. 11A shows positional relationships between an intermediate-contact-layer separating groove and a transparent-electrode separating groove adjacent thereto and between the intermediate-contact-layer separating groove and a connecting groove adjacent thereto, according to a comparative example.

FIG. 11A shows a comparative example in which a predetermined space (for example, about 100 nm) is provided between the transparent-electrode separating groove 12 and the intermediate-contact-layer separating groove 15 and between the intermediate-contact-layer separating groove 15 and the connecting groove 16. The cell dividing groove 18 is formed adjacent to the connecting groove 16 with a predetermined space (for example, about 100 nm) therebetween. As indicated by reference symbol N0 in the figure, a region from the transparent-electrode separating groove 12 to the cell dividing groove 18 serves as an inactive power-generation region N0 that does not contribute to power generation.

Figure 11B:
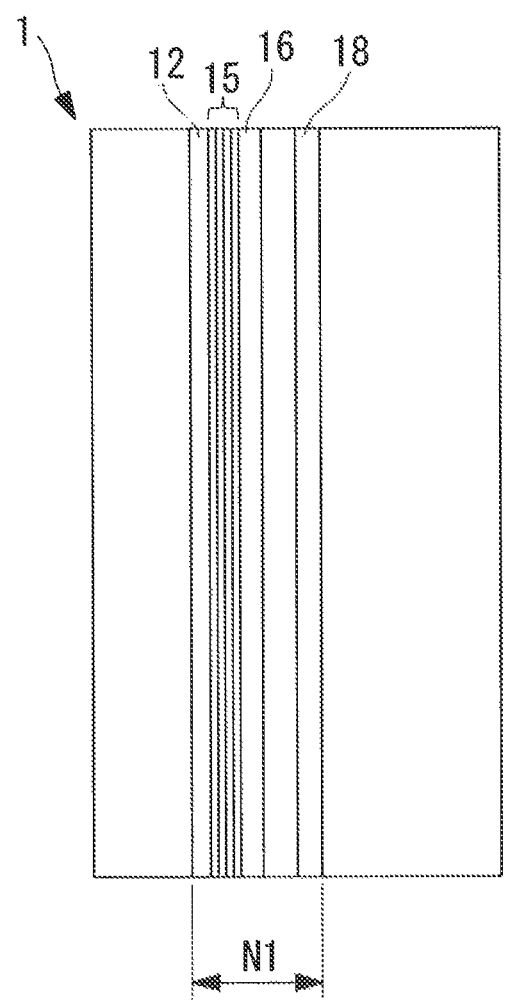
FIG. 11B is a plan view showing positional relationships between an intermediate-contact-layer separating groove and a transparent-electrode separating groove adjacent thereto and between the intermediate-contact-layer separating groove and a connecting groove adjacent thereto, according to a fourth embodiment.

In this embodiment, as shown in FIG. 11B, the transparent-electrode separating groove 12 and the intermediate-contact-layer separating groove 15 are made adjacent to each other and partially overlapped with each other, and the intermediate-contact-layer separating groove 15 and the connecting groove 16 are also made adjacent to each other and partially overlapped with each other. Thus, compared with the comparative example shown in FIG. 11A, an inactive power-generation region N1 can be made smaller, and the power-generating capacity with respect to the power-generating area can be improved.

In this embodiment, since a plurality of processed grooves are formed as the intermediate-contact-layer separating groove 15, even when the intermediate-contact-layer separating groove 15 is partially overlapped with the transparent-electrode separating groove 12 and the connecting groove 16, only the processed grooves that are located outward are overlapped, and the processed grooves that are located closer to the center are not overlapped. Therefore, the intermediate-contact-layer separating groove maintains its function. Furthermore, of the intermediate-contact-layer separating groove 15, processed grooves that are located outward have small processing depths because the energy density is generally small in processing (for example, see FIG. 4B), and therefore, they do not reach the substrate-side electrode.

In this embodiment, the transparent-electrode separating groove 12 and the connecting groove 16 are both partially overlapped with the intermediate-contact-layer separating groove 15; however, the inactive power-generation region can be made smaller even if only one of them is overlapped therewith.

REFERENCE SIGNS LIST 1 glass substrate
2 transparent electrode layer
4 back electrode layer
5 power generation cell
10 solar cell (photoelectric conversion device)
15 intermediate-contact-layer separating groove (processed groove)
15a first processed groove
15b second processed groove
15c third processed groove
20 recrystallized region
22 picosecond-laser oscillator
26 interference-fringe forming means
50 laser-intensity-distribution equalizing means
91 top layer (first photoelectric conversion layer)
92 bottom layer (second photoelectric conversion layer)
93 intermediate contact layer

The invention claimed is:

1. A method for manufacturing a photoelectric-conversion-device comprising:
  a first-photoelectric-conversion-layer forming step of forming a first photoelectric conversion layer formed mainly of silicon;
  an intermediate-contact-layer forming step of forming, on the first photoelectric conversion layer, an intermediate contact layer that is electrically and optically connected to the first photoelectric conversion layer;
  an intermediate-contact-layer separating step of irradiating the intermediate contact layer with a laser and moving the laser relative to the intermediate contact layer to remove the intermediate contact layer through laser irradiation, thereby forming an intermediate-contact-layer separating groove that reaches the first photoelectric conversion layer, in a predetermined scanning direction; and
  a second-photoelectric-conversion-layer forming step of forming, on the intermediate contact layer and in the intermediate-contact-layer separating groove, a second photoelectric conversion layer that is electrically and optically connected to the intermediate contact layer and that is formed mainly of silicon,
  wherein, in the intermediate-contact-layer separating step, interference fringes arranged in parallel in one direction are formed in an irradiated area corresponding to a beam diameter of the laser so that bright areas and dark areas of the interference fringes are arranged in parallel to the scanning direction of the laser, and the laser is relatively moved such that the interference fringes are continuously joined in the scanning direction, and
  wherein the intermediate-contact-layer separating groove is terminated at a mid-position in the first photoelectric conversion layer.

2. A method for manufacturing a photoelectric-conversion-device according to claim 1, wherein the intermediate contact layer is irradiated with the laser after an intensity distribution of the laser in the irradiated area is equalized.

3. A method for manufacturing a photoelectric-conversion-device according to claim 1, wherein the intermediate-contact-layer separating step is performed with a pulsed laser having a pulse width of not less than 10 ps and not more than 750 ps.

4. A method for manufacturing a photoelectric-conversion-device according to claim 1, further comprising:
  before the first-photoelectric-conversion-layer forming step, a substrate-side-electrode forming step of forming a substrate-side electrode on a substrate, and a substrate-side-electrode-separating-groove forming step of forming a substrate-side-electrode separating groove by removing the substrate-side electrode; and
  after the second-photoelectric-conversion-layer forming step, a connecting-groove forming step of removing the second photoelectric conversion layer, the intermediate contact layer, and the first photoelectric conversion layer and of forming a connecting groove that electrically connects a back electrode and the substrate-side electrode,
  wherein the intermediate-contact-layer separating step is performed such that the intermediate-contact-layer separating groove is adjacent to and is partially overlapped with the substrate-side-electrode separating groove; and/or
  the connecting-groove forming step is performed such that the connecting groove is adjacent to and is partially overlapped with the intermediate-contact-layer separating groove.

5. A method for manufacturing a photoelectric-conversion-device according to claim 1, wherein the laser is a pulsed laser; and in the intermediate-contact-layer separating step, when the intermediate-contact-layer separating groove is continuously formed by partially overlapping a plurality of the irradiated areas irradiated with the pulsed laser, adjacent irradiated areas are overlapped such that a plurality of the bright areas of the interference fringes are continuous.

6. A method for manufacturing a photoelectric-conversion-device according to claim 5, wherein the irradiated area has a substantially rectangular shape; and in the intermediate-contact layer separating step, one side of the irradiated area, having the rectangular shape, is partially overlapped with one side of other irradiated area adjacent thereto.

7. A method for manufacturing a photoelectric-conversion-device according to claim 1, wherein the intermediate-contact-layer separating step includes steps of splitting a laser beam into two split laser beams, interfering the two split laser beams to interfere with each other, combining the two split laser beams to form an interfered laser beam, and irradiating the interfered laser beam to the intermediate contact layer such that the bright areas and the dark areas of the interference fringes are formed in the irradiated area.

8. A method for manufacturing a photoelectric-conversion-device according to claim 7, wherein a plurality of intermediate-contact-layer separating grooves is formed by irradiating the laser on the intermediate contact layer corresponding to the bright areas of the interference fringes.

9. A method for manufacturing a photoelectric-conversion-device according to claim 8, wherein the plurality of intermediate contact layer separating grooves includes one groove having a groove depth longer than others.

10. A device for manufacturing a photoelectric-conversion-device comprising:
a first-photoelectric-conversion-layer forming device for forming a first photoelectric conversion layer formed mainly of silicon;
an intermediate-contact-layer forming device for forming, on the first photoelectric conversion layer, an intermediate contact layer that is electrically and optically connected to the first photoelectric conversion layer;
an intermediate-contact-layer separating device for removing the intermediate-contact-layer through laser irradiation to form an intermediate-contact-layer separating groove that reaches the first photoelectric conversion layer, thereby separating the intermediate contact layer, the intermediate-contact-layer separating device including a laser oscillator for irradiating the intermediate contact layer with a laser, a transporting device that moves the laser relative to the intermediate contact layer to form the intermediate-contact-layer separating groove in a predetermined scanning direction, and an interference-fringe forming device for forming interference fringes arranged in parallel in one direction in an irradiated area corresponding to a beam diameter of the laser so that bright areas and dark areas of the interference fringes are arranged in parallel to the scanning direction of the laser; and
a second-photoelectric-conversion-layer forming device for forming, on the intermediate contact layer and in the intermediate-contact-layer separating groove, a second photoelectric conversion layer that is electrically and optically connected to the intermediate contact layer and that is formed mainly of silicon,
wherein the transporting device is configured to relatively move the laser such that the interference fringes are continuously joined in the scanning direction, and
wherein the intermediate-contact-layer separating grooves are terminated at a mid-position in the first photoelectric conversion layer.

11. A device for manufacturing a photoelectric-conversion-device according to claim 10, further comprising an irradiated-area-shape modifying device for modifying a shape of the irradiated area to be substantially rectangular,
wherein the transporting device relatively moves the laser such that one side of the irradiated area, having the rectangular shape, is partially overlapped with one side of other irradiated area adjacent thereto.

12. A device for manufacturing a photoelectric-conversion-device according to claim 10, further comprising a laser-intensity-distribution equalizing device for equalizing an intensity distribution of the laser in the irradiated area.

13. A device for manufacturing a photoelectric-conversion-device according to claim 10, wherein the interference-fringe forming device further includes reflection mirrors for splitting a laser beam from the laser oscillator into two split laser beams to interfere with each other, combining two split laser beams to form an interfered laser beam, and irradiating the interfered laser beam to the intermediate-contact layer such that the bright areas and the dark areas of the interference fringes are formed in the irradiated area.

* * * * *